(12) United States Patent
Xi (10) Patent No.: US 11,444,105 B2
(45) Date of Patent: Sep. 13, 2022

(54) ARRAY SUBSTRATE AND MANUFACTURING METHOD THEREOF

(71) Applicant: Shenzhen China Star Optoelectronics Semiconductor Display Technology Co., Ltd., Guangdong (CN)

(72) Inventor: Suping Xi, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/621,238

(22) PCT Filed: Nov. 4, 2019

(86) PCT No.: PCT/CN2019/115415
§ 371 (c)(1),
(2) Date: Dec. 11, 2019

(87) PCT Pub. No.: WO2020/253031
PCT Pub. Date: Dec. 24, 2020

(65) Prior Publication Data
US 2020/0411557 A1    Dec. 31, 2020

(30) Foreign Application Priority Data
Jun. 21, 2019    (CN) .......................... 201910542090.X (51) Int. Cl.
*H01L 27/12*    (2006.01)

(52) U.S. Cl.
CPC ........ *H01L 27/124* (2013.01); *H01L 27/1255* (2013.01); *H01L 27/1259* (2013.01)

(58) Field of Classification Search
CPC ......... G02F 1/134318; G02F 1/134345; G02F 1/136213; G02F 1/13624; G02F 1/136227; H01L 27/124
See application file for complete search history.

(56) References Cited

U.S. PATENT DOCUMENTS

| 2008/0246038 | A1 | 10/2008 | Um et al. |
| 2012/0105416 | A1 | 5/2012 | Um et al. |
| 2016/0299392 | A1* | 10/2016 | Cheng .................. G02F 1/1368 |

(Continued)

FOREIGN PATENT DOCUMENTS

| CN | 101424841 A | 5/2009 |
| CN | 101989015 A | 3/2011 |

(Continued)

*Primary Examiner* — Peter M Albrecht
(74) *Attorney, Agent, or Firm* — Mark M. Friedman (57) ABSTRACT

The present invention provides an array substrate and a manufacturing method thereof, an array substrate includes a sub-pixel including a main-region and a sub-region. A gate line is disposed between the main-region and the sub-region, and two adjacent data lines define a pixel boundary. A transparent common electrode line is respectively disposed corresponding to the main-region and the sub-region. Wherein, a projection range of the pixel electrode on the substrate covers a projection range of part of the transparent common electrode line corresponding to a direction of the data line on the substrate.

6 Claims, 6 Drawing Sheets

(56) References Cited

U.S. PATENT DOCUMENTS

2018/0299734 A1   10/2018  Gan
2019/0157301 A1*  5/2019  Zhou .................. H01L 27/1248

FOREIGN PATENT DOCUMENTS

| CN | 106773432 A | * | 5/2017 |
|----|-------------|---|--------|
| CN | 107065352 A |   | 8/2017 |
| CN | 107797354 A |   | 3/2018 |
| CN | 109459894 A |   | 3/2019 |
| CN | 110335372 A |   | 10/2019 |

* cited by examiner

ARRAY SUBSTRATE AND MANUFACTURING METHOD THEREOF

FIELD OF INVENTION

The disclosure relates to the array substrate field, and more particularly, to an array substrate and a manufacturing method thereof.

BACKGROUND OF INVENTION

As the size of panels becomes larger and larger, backlights are correspondingly becoming larger and larger, namely, backlight heating will increase. But the heat dissipation of large-sized backlights cannot be handled properly in the prior art, thereby affecting performance of panels. In general method increasing the transmittance of panels to reduce the brightness of backlights, effectively prevents backlight heating. However, it is difficult to increase the transmittance for high-resolution, large-sized, and high-profile products. Therefore, how to reduce the heating of large-size backlights and how to dissipate become a hot spot for large-sized panels.

Therefore, there are drawbacks needed to improve in the prior art.

SUMMARY OF INVENTION

The present disclosure provides an array substrate and a manufacturing method thereof that effectively increases the aperture ratio of pixels, thereby effectively increasing the transmittance of panels to resolve the technical problem of smaller pixel aperture ratio and large backlight heating.

To achieve the above technical problem, the technical solutions provided by the present disclosure are as follows.

The present disclosure provides an array substrate comprising a sub-pixel disposed on a substrate in an array, and each of the sub-pixel comprises a main-region and a sub-region. A gate line is disposed corresponding to each row of the sub-pixels and disposed between the main-region and the sub-region, and a data line is disposed corresponding to each column of the sub-pixels, and two adjacent data lines defines a pixel boundary. A transparent common electrode line is disposed on the same layer with the gate line and respectively disposed corresponding to the main-region and the sub-region. A pixel electrode comprises a main-region pixel electrode disposed corresponding to the main-region and a sub-region pixel electrode disposed corresponding to the sub-region. Wherein, a projection range of the pixel electrode on the substrate at least covers a part of a projection range of the transparent common electrode line corresponding to a direction of the data line on the substrate.

In the array substrate of the present disclosure, the sub-pixel comprises a main-region thin film transistor, a sub-region thin film transistor, and a shared thin film transistor, the main-region pixel electrode is connected to a drain of the main-region thin film transistor through a through-hole, and the sub-region pixel electrode is connected to a drain of the sub-region thin film transistor through the through-hole.

In the array substrate of the present disclosure, the projection range of the pixel electrode on the substrate covers a projection range of the transparent common electrode line on the substrate.

In the array substrate of the present disclosure, the projection range of the pixel electrode on the substrate covers a projection range of the through-hole on the substrate.

In the array substrate of the present disclosure, the main-region comprises a main-region storage electrode, the main-region storage electrode and the part of the transparent common electrode line corresponding to the main-region are insulated by a dielectric layer and form a main-region storage capacitor. The sub-region comprises a sub-region storage electrode, and the sub-region storage electrode and the part of the transparent common electrode line corresponding to the sub-region are insulated by a dielectric layer and form a sub-region storage capacitor.

In the array substrate of the present disclosure, both a projection of the main-region storage electrode and a projection of the sub-region storage electrode on the substrate are formed in the projection range of the pixel electrode on the substrate.

In the array substrate of the present disclosure, a projection of the through-hole on the substrate are formed in the projection range of the pixel electrode on the substrate.

To achieve the above technical problem, the present disclosure provides a manufacturing method of array substrate comprising the below steps.

Step S10: sequentially forming a first metal thin film and a first transparent conductive thin film on a substrate, forming a patterned first metal layer and a transparent common electrode line by photolithography process. The first metal layer comprises a gate used for forming a main-region thin film transistor, a sub-region thin film transistor, and a shared thin film transistor and a gate line connected thereto, and the gate line divides a pixel into a main-region and a sub-region.

Step S20: sequentially forming a gate insulation layer and a second metal thin film on the substrate on which the transparent common electrode line is disposed, performing photolithography process on the second metal film to form a second metal layer, and the second metal layer comprises a data line intersecting with the gate line, a source/drain of the main-region thin film transistor, the sub-region thin film transistor, and the shared thin film transistor.

Step S30: sequentially forming a passivation layer, a second transparent conductive thin film on the source/drain, patterning the second transparent conductive thin film to form a main-region pixel electrode corresponding to the main-region and a sub-region pixel electrode corresponding to the sub-region, and a projection range of the main-region pixel electrode and the sub-region pixel electrode on the substrate covers a projection range of the transparent common electrode line corresponding to part of the main-region and the sub-region on the substrate.

In the manufacturing method of the present disclosure, the step S30 comprises the below step.

Step S301: patterning the passivation layer to form a through-hole, the main-region pixel electrode and the sub-region pixel electrode are respectively connected to a drain of the main-region thin film transistor and a drain of the sub-region thin film transistor through the through-hole. Wherein, a projection of through-hole on the substrate are formed in the projection range of the main-region pixel electrode and the sub-region pixel electrode on the substrate.

In the manufacturing method of the present disclosure, the second metal layer comprises a main-region storage electrode corresponding to the main-region and a sub-region storage electrode corresponding to the sub-region, wherein, a projection of the main-region storage electrode and a projection of the sub-region storage electrode on the substrate are respectively formed in the projection range of the main-region pixel electrode and the sub-region pixel electrode on the substrate.

To achieve the above technical problem, the present disclosure further provides an array substrate comprising a sub-pixel disposed on a substrate in an array, and each of the sub-pixel comprises a main-region and a sub-region. A gate line is disposed corresponding to each row of the sub-pixels and disposed between the main-region and the sub-region, and a data line is disposed corresponding to each column of the sub-pixels, and two adjacent data lines defines a pixel boundary. A transparent common electrode line is disposed on the same layer with the gate line and respectively disposed corresponding to the main-region and the sub-region. A pixel electrode comprises a main-region pixel electrode disposed corresponding to the main-region and a sub-region pixel electrode disposed corresponding to the sub-region, and the pixel electrode is a transparent electrode. Wherein, a projection range of the pixel electrode on the substrate at least covers a part of a projection range of the transparent common electrode line corresponding to a direction of the data line on the substrate.

In the array substrate of the present disclosure, the sub-pixel comprises a main-region thin film transistor, a sub-region thin film transistor, and a shared thin film transistor, the main-region pixel electrode is connected to a drain of the main-region thin film transistor through a through-hole, and the sub-region pixel electrode is connected to a drain of the sub-region thin film transistor through the through-hole.

In the array substrate of the present disclosure, the projection range of the pixel electrode on the substrate covers a projection range of the transparent common electrode line on the substrate.

In the array substrate of the present disclosure, the projection range of the pixel electrode on the substrate covers a projection range of the through-hole on the substrate.

In the array substrate of the present disclosure, the main-region comprises a main-region storage electrode, the main-region storage electrode and the part of the transparent common electrode line corresponding to the main-region are insulated by a dielectric layer and form a main-region storage capacitor. The sub-region comprises a sub-region storage electrode, and the sub-region storage electrode and the part of the transparent common electrode line corresponding to the sub-region are insulated by a dielectric layer and form a sub-region storage capacitor.

In the array substrate of the present disclosure, both a projection of the main-region storage electrode and a projection of the sub-region storage electrode on the substrate are formed in the projection range of the pixel electrode on the substrate.

In the array substrate of the present disclosure, a projection of the through-hole on the substrate are formed in the projection range of the pixel electrode on the substrate.

The advantageous effects of the present disclosure are that, the present disclosure provides an array substrate and a manufacturing method thereof compared with the present large-sized panel, a common electrode line made by a first metal layer is replaced by a transparent common electrode line made by a transparent conductive material. In the manufacturing pixel electrodes process, a main-region and a sub-region of pixel are entirely filled with pixel electrodes, the transparent common electrode of the main-region and the sub-region is disposed below the pixel electrode, and a through-hole connecting the pixel electrode to a drain of a thin film transistor is disposed below the pixel electrode, thereby increasing the aperture ratio of pixels in a direction of a data line and in a direction of a gate line, further increasing the transmittance of pixels, so that the technical problem of large backlight heating can be resolved.

DESCRIPTION OF DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as upper, lower, front, back, left, right, inner, outer, side, etc., are only directions by referring to the accompanying drawings. Thus, the used directional terms are used to describe and understand the present disclosure, but the present disclosure is not limited thereto. In figures, elements with similar structures are indicated by the same numbers.

The present application is directed to the present large-sized panels having technical problems that are low pixel aperture ratio, low transmittance, and serious backlight heating. The present embodiment can resolve the defects.

Figure 1:
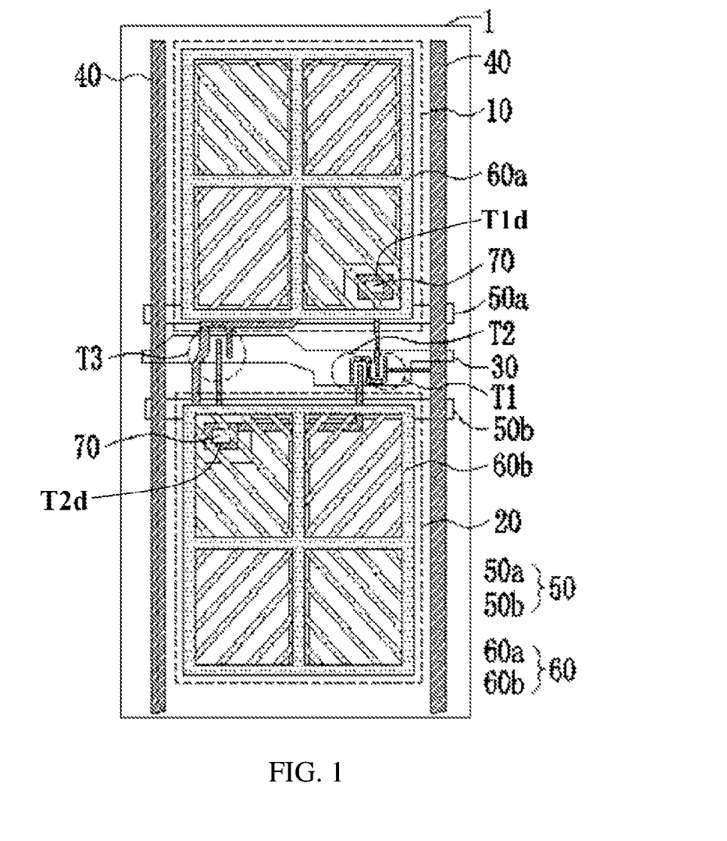
FIG. 1 is a schematic structural diagram of an array substrate provided by an embodiment of the present disclosure.

As shown in FIG. 1, FIG. 1 is a schematic structural diagram of an array substrate provided by an embodiment of the present disclosure. The array substrate comprises a sub-pixel disposed on a substrate 1 in an array, and each of the sub-pixel comprises a main-region 10 and a sub-region 20. A gate line 30 is disposed corresponding to each row of the sub-pixels and disposed between the main-region 10 and the sub-region 20, and a data line 40 is disposed corresponding to each column of the sub-pixels, and two adjacent data lines 40 defines a pixel boundary. A transparent common electrode line 50 is disposed on the same layer with the gate line 30 and comprises a main-region transparent common electrode line 50a corresponding to the main-region 10 and a sub-region transparent common electrode line 50b corresponding to the sub-region 20. A pixel electrode 60 comprises a main-region pixel electrode 60a disposed corresponding to the main-region 10 and a sub-region pixel electrode 60b disposed corresponding to the sub-region 20. The sub-pixel further comprises a main-region thin film transistor T1, a sub-region thin film transistor T2, and a shared thin film transistor T3, the main-region pixel electrode 60a is connected to a drain Tld of the main-region thin film transistor T1 through a through-hole 70, and the sub-region pixel electrode 60b is connected to a drain T2d of the sub-region thin film transistor T2 through the through-hole 70.

Wherein, a projection range of the pixel electrode 60 on the substrate 1 at least covers a part of a projection range of the transparent common electrode line 50 corresponding to a direction of the data line 40 on the substrate 1. Since the transparent common electrode line 50 is a transparent material, the pixel electrode 60 may cover above the transparent common electrode line 50.

When the pixel electrode 60 covers a part of the transparent common electrode line 50 corresponding to a direction of the data line 40, since the pixel electrode 60 increase a width along a direction of the gate line 30, the pixel aperture ratio is increased, thereby increasing the transmittance of pixels which is enable the brightness of backlights matched with the array substrate to be appropriately reduced, thereby reducing backlight heating.

Further, in the main-region 10 and the sub-region 20, the projection range of the pixel electrode 60 on the substrate 1 covers a projection range of the transparent common electrode line 50 on the substrate 1. Since the pixel electrode 60 increase a length on the direction of the data line 40, namely, the pixel electrode 60 covers the part of the transparent common electrode line 50 corresponding to the direction of the gate line 30, the pixel aperture ratio is further increased, thereby increasing the transmittance of pixels and reducing backlight heating.

Further, the projection range of the pixel electrode 60 on the substrate 1 covers a projection range of the through-hole 70 on the substrate 1. This design causes the pixel electrode 60 to be closer to the gate line 30 in a relative position, and a region occupied by the through-hole 70 is relatively small, so that the pixel opening is increased again.

Figure 6:
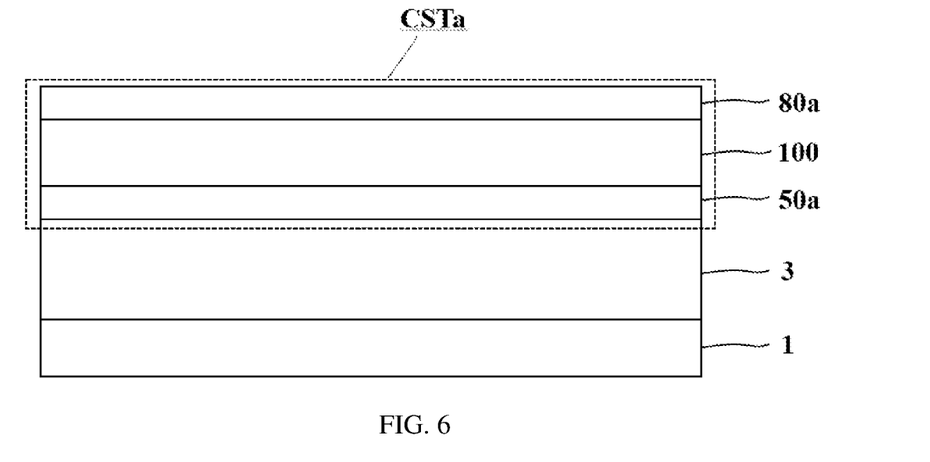
FIG. 6 a schematic cross-sectional view of a configuration of a main-region storage capacitor provided by an embodiment of the present application.
Figure 7:
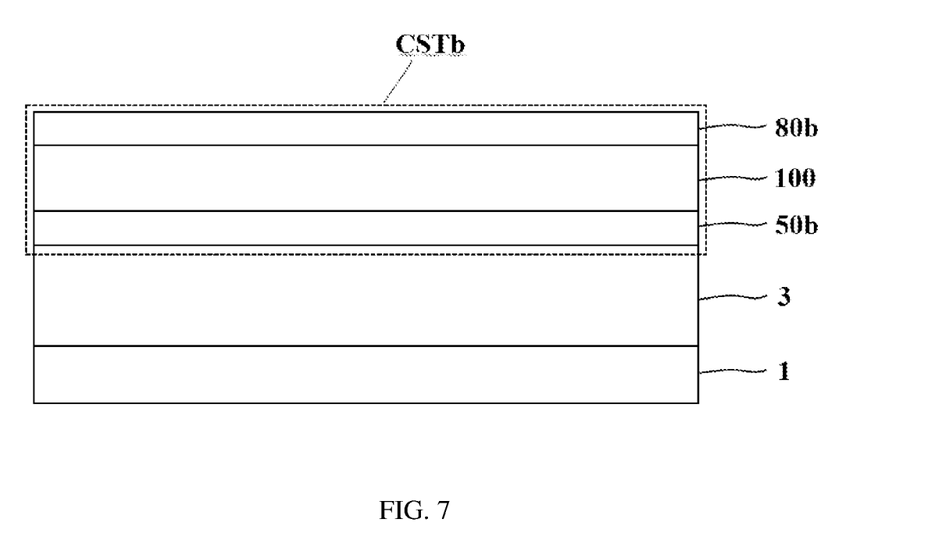
FIG. 7 is a schematic cross-sectional view of a configuration of a sub-region storage capacitor provided by an embodiment of the present application.

The characteristics in one embodiment compared with above embodiment is that, the main-region 10 further comprises a main-region storage electrode 80a, the main-region storage electrode 80a and the main-region transparent common electrode line 50a are insulated by a dielectric layer 100 and form a main-region storage capacitor CSTa. The sub-region 20 comprises a sub-region storage electrode 80b, and the sub-region storage electrode 80b and the sub-region transparent common electrode line 50b are insulated by a dielectric layer 100 and form a sub-region storage capacitor CSTb.

Wherein, both a projection of the main-region storage electrode and a projection of the sub-region storage electrode on the substrate 1 are formed in the projection range of the pixel electrode 60 on the substrate 1.

Further, the main-region pixel electrode 60a is connected to a drain T1d of the main-region thin film transistor T1 through a through-hole 70, and the sub-region pixel electrode 60b is connected to a drain T2d of the sub-region thin film transistor T2. The projection range of the through-hole 70 on the substrate 1 is in a projection range of the pixel electrode 60 on the substrate 1, thereby achieving maximum pixel opening.

Figure 2:
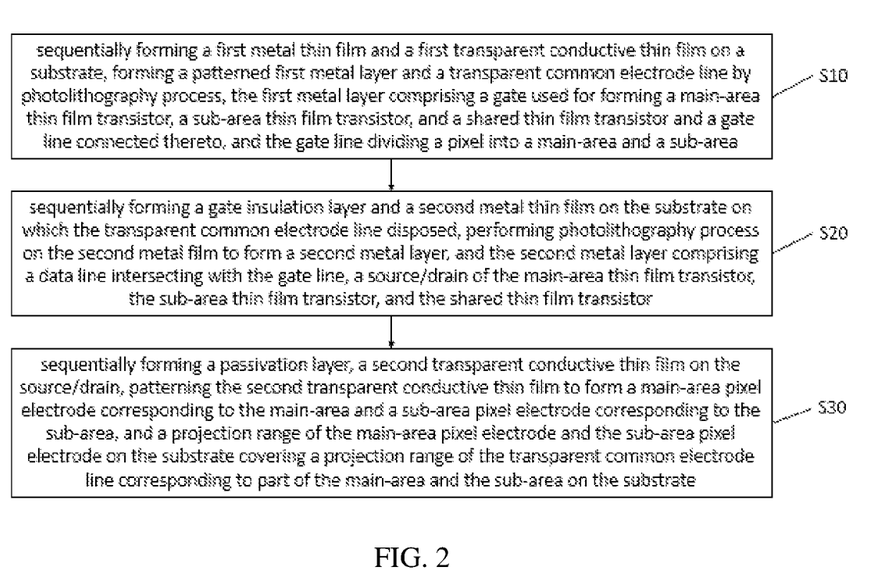
FIG. 2 is a flowchart diagram of a manufacturing method of an array substrate provided by an embodiment of the present disclosure.

The present disclosure provides a manufacturing method of array substrate, as shown in FIG. 2 combined with FIG. 3 to FIG. 5, the method comprises the below steps.

Step S10: sequentially forming a first metal thin film and a first transparent conductive thin film on a substrate, forming a patterned first metal layer and a transparent common electrode line by photolithography process. The first metal layer comprises a gate used for forming a main-region thin film transistor, a sub-region thin film transistor, and a shared thin film transistor and a gate line connected thereto, and the gate line divides a pixel into a main-region and a sub-region.

Figure 3:
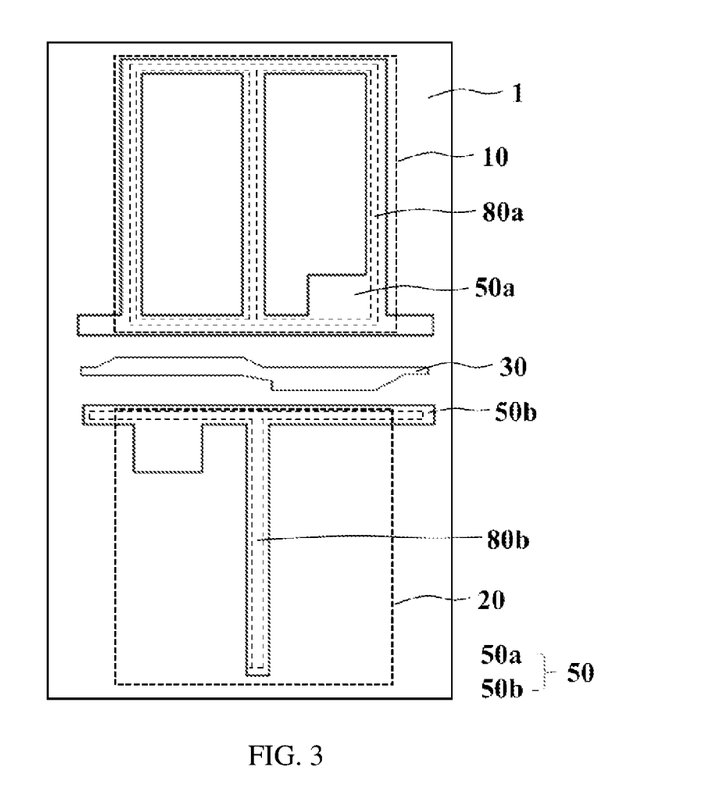
FIG. 3 to FIG. 5 are schematic diagrams of a manufacturing method of an array substrate provided by an embodiment of the present disclosure.

As shown combined with FIG. 3, a first metal thin film is deposited on the substrate 1 and patterned to form a first metal layer 3, the first metal layer 3 comprises a gate line 30 divides a pixel into a main-region 10 and a sub-region 20. And then a first transparent conductive thin film is disposed on the substrate 1 on which the gate line 30 is disposed and patterning to form a transparent common electrode line 50, and the transparent common electrode line 50 comprises a main-region transparent common electrode line 50a corresponding to the main-region 10 and a sub-region transparent common electrode line 50b corresponding to the sub-region 20.

The above steps are to form the gate line 30 and the transparent common electrode line 50 by two common mask processes, but it is not limited to this step, but can also be formed by other processes.

Step S20: forming a second metal thin film on the substrate on which the transparent common electrode line 50 is disposed, performing photolithography process on the second metal film to form a second metal layer, and the second metal layer comprises a data line intersecting with the gate line, a source/drain of the main-region thin film transistor, the sub-region thin film transistor, and the shared thin film transistor.

Figure 4:
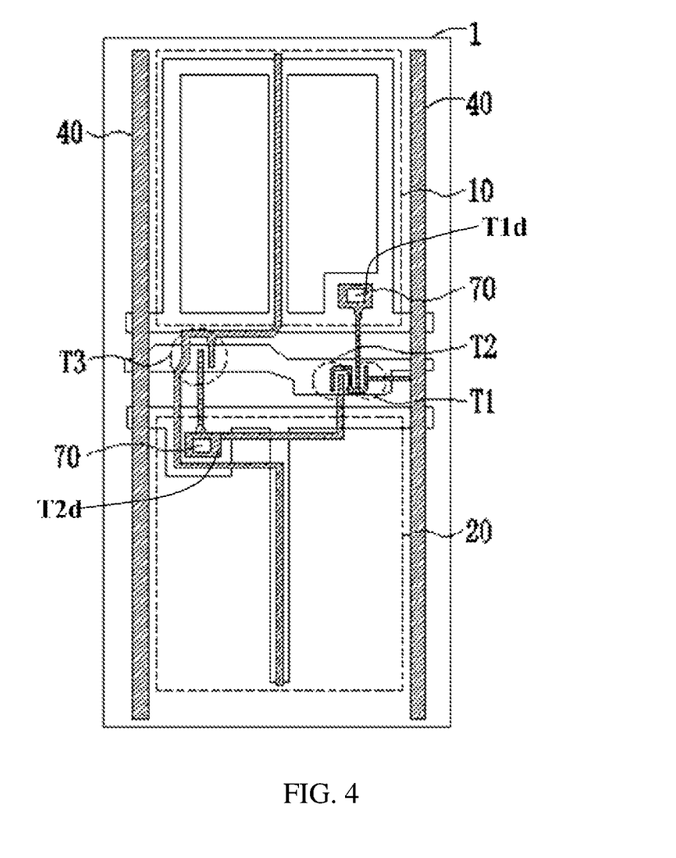

As shown combined with FIG. 4, the second metal thin film is patterned to form a data line 40 intersecting with the gate line 30, a source/drain of a main-region thin film transistor, a sub-region thin film transistor, and a shared thin film transistor, and other signal lines. Wherein, two adjacent data lines define a pixel boundary.

Step S30: forming a second transparent conductive thin film on the source/drain, patterning the second transparent conductive thin film to form a main-region pixel electrode corresponding to the main-region and a sub-region pixel electrode corresponding to the sub-region, and a projection range of the main-region pixel electrode and the sub-region pixel electrode on the substrate covers a projection range of the transparent common electrode line corresponding to part of the main-region and the sub-region on the substrate.

Wherein, the step S30 further comprises the below step.

Step S301: forming through-holes, the main-region pixel electrode and the sub-region pixel electrode are respectively connected to a drain of the main-region thin film transistor and a drain of the sub-region thin film transistor through the through-holes. Wherein, a projection of the through-holes on the substrate are formed in the projection range of the main-region pixel electrode and the sub-region pixel electrode on the substrate.

As specifically shown combined with FIG. 4, through-holes 70 for exposing a drain T1d of the main-region thin film transistor T1 and a drain T2d of the sub-region thin film transistor T2, wherein, the through-holes are respectively formed in the main-region 10 and the sub-region 20.

Figure 5:
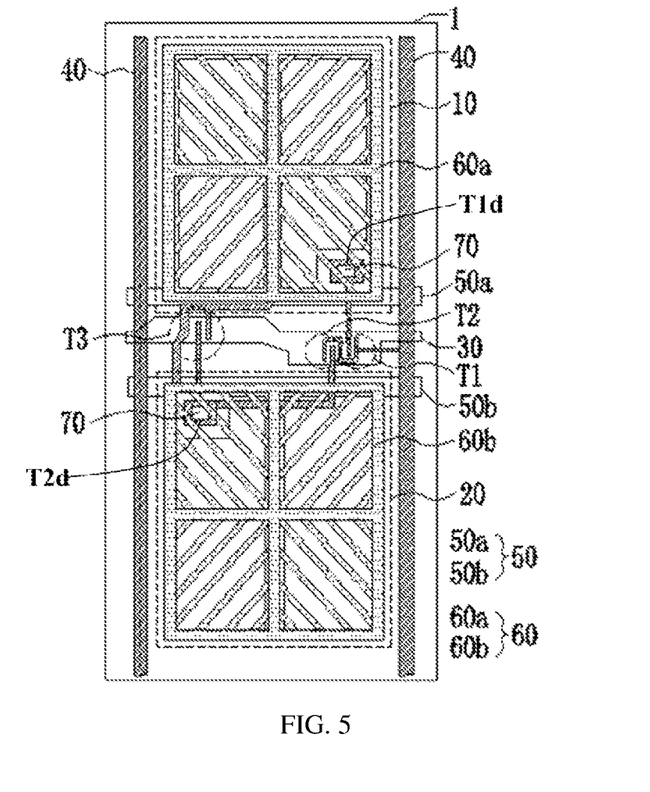

As shown combined with FIG. 5, the second transparent conductive thin film is patterned to form a main-region pixel electrode 60a corresponding to the main-region 10 and a sub-region pixel electrode 60b corresponding to the sub-region 20. In the main-region 10 and a sub-region 20, the projection range of the pixel electrode 60 on the substrate partially or completely covers the projection range of the transparent common electrode line 50 on the substrate. The pixel electrode 60 increase a length along a direction of the gate line 30 or the data line 40 in the present disclosure.

Therefore, the pixel aperture ratio is increased, thereby increasing the transmittance of pixels, further reducing backlight heating.

Further, the projection range of the pixel electrode 60 on the substrate covers a projection range of the through-hole 70 on the substrate. This design causes the pixel electrode 60 to be closer to the gate line 30 in a relative position, and a region occupied by the through-hole 70 is very small in actual process, thereby the pixel opening and the transmittance of pixels are further increased to achieve the purpose of reducing backlight heating.

In one embodiment, the second metal layer further comprises a main-region storage electrode 80a corresponding to the main-region 10 and a sub-region storage electrode 80b corresponding to the sub-region 20. Wherein, a projection of the main-region storage electrode 80a and a projection of the sub-region storage electrode 80b on the substrate are respectively formed in the projection range of the main-region pixel electrode 60a and the sub-region pixel electrode 60b on the substrate, thereby achieving maximum pixel opening.

In summary, the present disclosure provides an array substrate and a manufacturing method thereof, a common electrode line made by a first metal layer is replaced by a transparent common electrode line made by a transparent conductive material. In the manufacturing pixel electrodes process, a main-region and a sub-region of pixel are entirely filled with pixel electrodes, the transparent common electrode of the main-region and the sub-region is disposed below the pixel electrode, and a through-hole connecting the pixel electrode to a drain of a thin film transistor is disposed below the pixel electrode, thereby increasing the aperture ratio of pixels in a direction of a data line and in a direction of a gate line, further increasing the transmittance of pixels, so that the technical problem of large backlight heating can be resolved.

In summary, while the present disclosure has been disclosed via preferred embodiments as above, the preferred embodiments are not intended to limit the disclosure. Those skilled in the art can make various modifications and alterations without departing from the spirit and scope of the disclosure. The scope of protection of the disclosure is defined by the claims.

What is claimed is:

1. An array substrate, comprising:
a plurality of sub-pixels disposed on a substrate in an array, each of the sub-pixels comprising a main-region and a sub-region, wherein each of the sub-pixels comprises a main-region thin film transistor, a sub-region thin film transistor, and a shared thin film transistor;
a gate line disposed corresponding to each row of the sub-pixels and disposed between the main-region and the sub-region, a data line disposed corresponding to each column of the sub-pixels, and two adjacent data lines defining a pixel boundary;
a transparent common electrode line disposed on a same layer as the gate line and respectively disposed corresponding to the main-region and the sub-region; and
a pixel electrode comprising a main-region pixel electrode disposed corresponding to the main-region and a sub-region pixel electrode disposed corresponding to the sub-region, wherein both the main-region pixel electrode and the sub-region pixel electrode have a rectangular external contour, and the main-region pixel electrode is connected to a drain of the main-region thin film transistor through a through-hole, and the sub-region pixel electrode is connected to a drain of the sub-region thin film transistor through another through-hole;
wherein a projection range of the pixel electrode on the substrate at least covers a projection range of a part of the transparent common electrode line corresponding to the data line on the substrate and covers a projection range of the through-holes on the substrate; and
wherein the main-region comprises a main-region storage electrode, the main-region storage electrode and a part of the transparent common electrode line corresponding to the main-region are insulated by a dielectric layer and form a main-region storage capacitor; and
the sub-region comprises a sub-region storage electrode, and the sub-region storage electrode and a part of the transparent common electrode line corresponding to the sub-region are insulated by the dielectric layer and form a sub-region storage capacitor.

2. The array substrate as claimed in claim 1, wherein the projection range of the pixel electrode on the substrate further covers a projection range of a part of the transparent common electrode line corresponding to the gate line on the substrate.

3. The array substrate as claimed in claim 1, wherein both a projection of the main-region storage electrode on the substrate and a projection of the sub-region storage electrode on the substrate are formed in the projection range of the pixel electrode on the substrate.

4. An array substrate, comprising:
a plurality of sub-pixels disposed on a substrate in an array, each of the sub-pixels comprising a main-region and a sub-region, wherein each of the sub-pixels comprises a main-region thin film transistor, a sub-region thin film transistor, and a shared thin film transistor;
a gate line disposed corresponding to each row of the sub-pixels and disposed between the main-region and the sub-region, a data line disposed corresponding to each column of the sub-pixels, and two adjacent data lines defining a pixel boundary;
a transparent common electrode line disposed on a same layer as the gate line and respectively disposed corresponding to the main-region and the sub-region; and
a pixel electrode comprising a main-region pixel electrode disposed corresponding to the main-region and a sub-region pixel electrode disposed corresponding to the sub-region, wherein both the main-region pixel electrode and the sub-region pixel electrode have a rectangular external contour, and the main-region pixel electrode is connected to a drain of the main-region thin film transistor through a through-hole, and the sub-region pixel electrode is connected to a drain of the sub-region thin film transistor through another through-hole, and the pixel electrode is a transparent electrode;
wherein a projection range of the pixel electrode on the substrate at least covers a projection range of a part of the transparent common electrode line corresponding to the data line on the substrate and covers a projection range of the through-holes on the substrate;
wherein the main-region comprises a main-region storage electrode, the main-region storage electrode and a part of the transparent common electrode line corresponding to the main-region storage electrode are insulated by a dielectric layer and form a main-region storage capacitor; and
the sub-region comprises a sub-region storage electrode, and the sub-region storage electrode and a part of the transparent common electrode line corresponding to the sub-region storage electrode are insulated by the dielectric layer and form a sub-region storage capacitor.

5. The array substrate as claimed in claim 4, wherein the projection range of the pixel electrode on the substrate further covers a projection range of a part of the transparent common electrode line corresponding to the gate line on the substrate.

6. The array substrate as claimed in claim 4, wherein both a projection of the main-region storage electrode on the substrate and a projection of the sub-region storage electrode on the substrate are formed in the projection range of the pixel electrode on the substrate.

* * * * *